(12) United States Patent
Irie et al.

(10) Patent No.: US 8,648,206 B2
(45) Date of Patent: Feb. 11, 2014

(54) LIGHT-ACTIVATED ACTUATOR ELEMENT

(75) Inventors: Masahiro Irie, Fukuoka (JP); Shizuka Takami, Nihama (JP)

(73) Assignee: Kyushu University, National University Corporation, Fukuoka (JP)

( * ) Notice: Subject to any disclaimer, the term of this patent is extended or adjusted under 35 U.S.C. 154(b) by 589 days.

(21) Appl. No.: 12/518,862

(22) PCT Filed: Oct. 22, 2007

(86) PCT No.: PCT/JP2007/070525
§ 371 (c)(1),
(2), (4) Date: Jun. 11, 2009

(87) PCT Pub. No.: WO2008/072419
PCT Pub. Date: Jun. 19, 2008

(65) Prior Publication Data
US 2010/0016608 A1    Jan. 21, 2010

(30) Foreign Application Priority Data

Dec. 15, 2006   (JP) .................. 2006-337814

(51) Int. Cl.
*C07D 417/08* (2006.01)
(52) U.S. Cl.
USPC .......................................... 548/202; 548/205
(58) Field of Classification Search
USPC ................................................. 548/202, 205
See application file for complete search history.

(56) References Cited

PUBLICATIONS

Uchida et al. Tetrahedron 1998, 54, 6627-6638.*
Iwata et al. J. Org. Chem. 1992, 57, 3726-3727.*
Kuroki et al. Chem. Commun. 2005, 6005-6007.*
Irie, M. Chem. Rev. 2000, 100, 1685-1716.*
B. Rodriquez-Spong et al. Advanced Drug Delivery Reviews, 2004, 56, p. 263.*
Schultheiss et al. Crystal Growth & Design 2009, 9, 2950-2967.*
Definition of "shape", Merriam-Webster Online Dictionary, Accessed Mar. 16, 2011.*

(Continued)

*Primary Examiner* — Joseph Kosack
*Assistant Examiner* — Matthew Coughlin
(74) *Attorney, Agent, or Firm* — Fay Sharpe LLP

(57) ABSTRACT

Disclosed is light-driven actuator element characterized in that, inter alia, it can be reduced to micrometer size, is rapidly responsive, and reversibly changes to enable repeated use. The light-driven actuator element includes a crystal of diarylethene compound which changes shape upon photoisomerization (e.g., the compound of Structural Formula (I) below, where $R^1$ represents a hydrogen atom or methyl group and $R^2$ represents a methyl group). The element can be a rod-shaped or plate-like microcrystal having a size on the order of micrometer. The element bends (or contracts) on irradiation with ultraviolet light and expands to return to the original size on irradiation with visible light.

(I)

[CF 1]

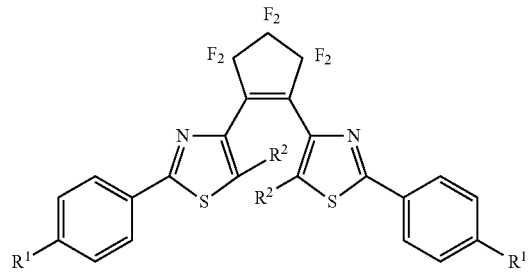

14 Claims, 8 Drawing Sheets

Open form
(Ia)

Closed form
(Ib)

(56) References Cited

PUBLICATIONS

Reddy, et al. "Structural basis for bending of organic crystals," *Chem. Communications*, p. 3945-3947, 2005.

Kobatake, et al. "Single-Crystalline Photochromism of Diarylethenes," *Bull. Chem. Soc. Jpn.*, 77, pp. 195-210, 2004.

Kobatake, et al. "Rapid and Reversible shape changes of molecular crystals on photoirradiation", Nature, Apr. 12, 2007, vol. 446, pp. 778-781.

Kobatake, et al. "Reversible Shape Changes of Molecular Crystals by Photoirradiation", Supplementary Information, Nature, Retrieved from www.nature.com/nature, pp. 1-16, 2007.

* cited by examiner

Ultraviolet light
(Contraction)

Visible light
(Expansion)

Open ring structure

Closed ring structure 1) (010) face 2) (00-1) face

↔ : Direction of expansion/contraction 3) (021) face 4) (0-11) face

Open form
(Ia)

Closed form
(Ib)

Plate crystal

Rod-like crystal

Open form Ia (Front)    Closed form Ib (Front)

Open form Ia (Side)    Closed form Ib (Side)

355 nm (8 ns photoirradiation)

Rod-like crystal

Plate crystal 1) (0 1 1) face 2) (1 0 0) face

3) Fine crystal appearance 1) (−1 1 1) face 2) (0 −1 1) face

3) Fine crystal appearance

A.

B.

LIGHT-ACTIVATED ACTUATOR ELEMENT

TECHNICAL FIELD

The present invention belongs to the technical field of micromachines and micromachining, and relates particularly to a microscopic actuator element that utilizes the photoisomerization of a photochromic compound.

BACKGROUND ART

Micromachines are extremely small machines with potential for utilization in fields such as micromechanics, biology and chemistry. They require very minutely structured actuator elements for their operation. Ordinary actuating devices of the electric power driven type require wiring or the like and are therefore not suitable for miniaturization. However, optical actuators driven by external stimuli utilizing photoirradiation can be configured to have integrated sensor and drive units, and since this advantageously eliminates the need for wiring or the like, actuator miniaturization is possible. Patent Reference No. 1 teaches an actuator element that utilizes voltage produced by an element exhibiting a photovoltaic effect on photoirradiation to enable movement of the actuator by the static electric force produced by the voltage. However, micro-level size reduction of the constituent element is difficult. Patent Reference No. 2 teaches an actuator element that utilizes an optical fiber, which is of simple structure and can also be micro-sized. However, the need to connect a light source to the actuator makes configuration of a tiny structure difficult.

Among the reported electrically driven actuators that do not require wiring are some that use ionic polymer film. Patent Reference No. 3 teaches driving of a polymer film by application of a voltage in a mixed solution of water and a polar organic solvent. However, this works only in a liquid and does not function in a dry system.

Patent Reference No. 4 teaches a chemo-mechanical material that produces mechanical deformation by chemical change of an organic compound, but the material has problems regarding response and weak force generation. Patent Reference No. 5 teaches use of a polydiacetylene compound exhibiting phase change on photoirradiation as a light-driven micro-actuator, but reversible photoinduced phase change is possible only in a specific temperature region and the efficiency of the photoinduced phase change is very low, so that repeated use is difficult.

A compound that reversibly forms two structural isomers of different color on irradiation with light is called a photochromic compound. The inventors propose diarylethene as a class of excellent compounds exhibiting photochromism. As set out in Non-Patent Reference No. 1 authored by the present inventors, diarylethene derivatives (diarylethene compounds) are characterized by excellent repetition durability in photoisomerization and stability of both isomers formed. In addition, as set out in Non-Patent Reference No. 2, also authored by the present inventors, derivatives that exhibit photochromism in the crystalline phase were also found, and application to optical recording materials and display materials is under study. Further, the inventors discovered that 1,2-bis(5-methyl-2-phenyl-4-thiazolyl)perfluorocylopentene mentioned in Patent Reference No. 6 is a diarylethene compound having a thiazole ring at the aryl position and is characterized by having higher stability than a diarylethene compound having thiophene at the aryl position. However, crystalline photochromism of this compound has not been reported.

[Patent Reference No. 1]: Japanese Patent Application Publication No. 2001-145379
[Patent Reference No. 2]: Japanese Patent Application Publication No. H5-180148
[Patent Reference No. 3]: Japanese Patent Application Publication No. 2006-54951
[Patent Reference No. 4]: Japanese Patent Application Publication No. H8-86272
[Patent Reference No. 5]: Japanese Patent Application Publication No. 2001-232600
[Patent Reference No. 6]: Japanese Patent Application Publication No. H10-45732
[Non-Patent Reference No. 1]: Chem. Rev., 100, 1685-1716 (2000).
[Non-Patent Reference No. 2]: Bull. Chem. Soc. Jpn., 77, 195-210 (2004).

DISCLOSURE OF THE INVENTION

Problems to be Solved by the Invention

The object of this invention is to overcome the aforesaid problems of the prior art and to provide a new type of light-driven actuator element characterized in that, inter alia, it can be reduced to micrometer size, is rapidly responsive, and reversibly changes to enable repeated use.

Means for Solving the Problems

The inventors discovered, among photochromic compounds, molecular materials that enable ready preparation of micro-order size crystals, which reversibly contract and expand (bend and recover owing to local contraction) when photoirradiated and whose shape-change response upon photoirradiation is extremely rapid. They derived the present invention from this discovery.

Thus, the present invention provides a light-driven actuator element characterized in comprising a crystal of a diarylethene compound that changes shape by photoisomerization.

BEST MODE FOR CARRYING OUT THE INVENTION

Figure 1:
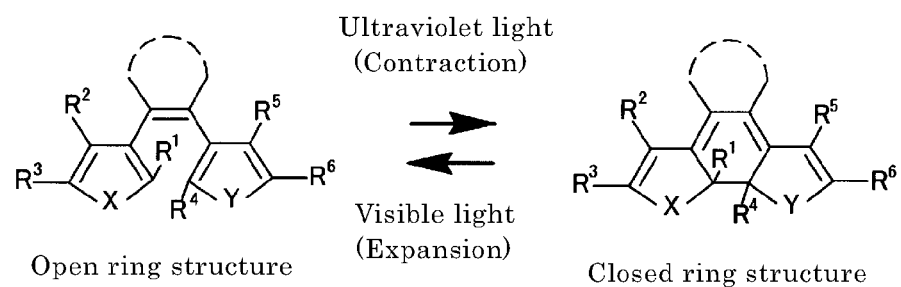
FIG. 1 shows photoisomerization-induced structural change of a diarylethene compound utilized in the light-driven actuator element of the present invention.

The diarylethene compounds used in the present invention are a group of compounds with a structure having an ethene ring at the center and aryl groups on opposite sides of the ethene ring. The central hexanetriene site of such a diarylethene compound changes from an open ring structure to a closed ring structure upon irradiation with ultraviolet light and returns to the original state upon irradiation with visible light. These structural changes produce changes in color. The compound is colorless in the open-ring structure but in the closed-ring structure assumes a color such as red, blue or green depending on difference in substituents. The light-driven actuator element of the present invention comprises a crystal of such a photochromically reactive diarylethene compound whose shape is changed by photochromic reaction, specifically, for example, one that contracts (or bends owing to local contraction) upon irradiation with ultraviolet light and expands to recover its original size upon irradiation with visible light (see FIG. 1). The crystal of diarylethene compound used in the present invention is therefore characterized by having the crystal structure described in the following.

As a diarylethene compound preferable for use in the light-driven actuator element of the present invention can be mentioned, for example, a compound represented by Structural Formula (I) below, which compound turns red upon irradiation with ultraviolet light.

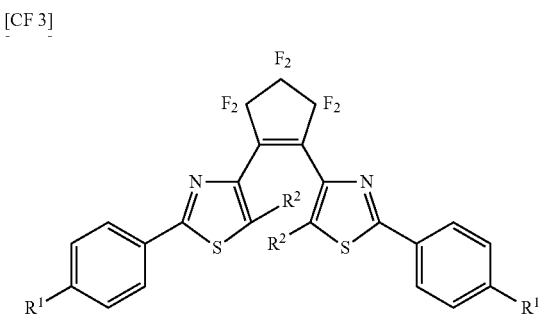

(I)

In Formula (I), $R^1$ represents a hydrogen atom or methyl group and $R^2$ represents a methyl group.

The diarylethene compound used in the light-driven actuator element of the present invention was found by X-ray structure analysis to exhibit a crystal structure in which the molecules are packed in parallel along the direction of the crystal axis of contraction and expansion. As pointed out in Control Experiments 1 and 2 set out in the following, the crystals of diarylethene compounds that do not satisfy this condition do not exhibit photoinduced shape change.

Figure 2:
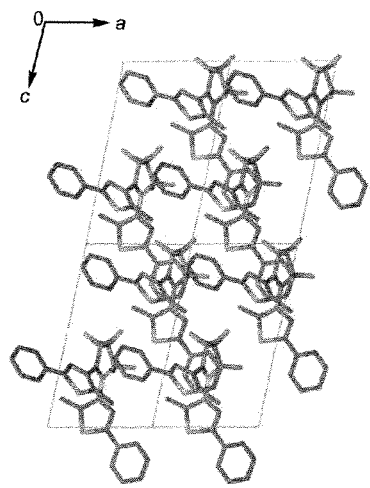
FIG. 2 illustrates the molecular packing of a crystal of a diarylethene compound utilized in the light-driven actuator element of the present invention. Plate crystal: (1) (010) face, (2) (00-1) face; Rod crystal: (3) (021) face, (4) (0-11) face.
Figure 2:
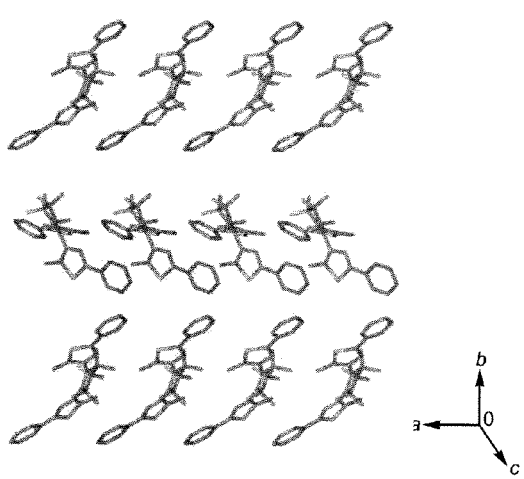
Figure 2:
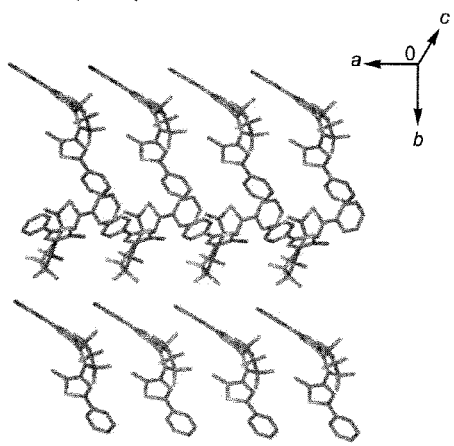
Figure 2:
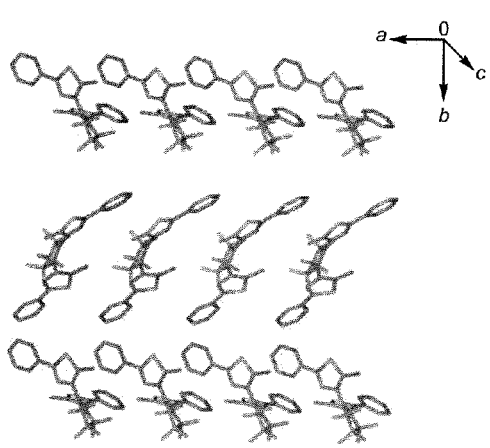
Figure 3:
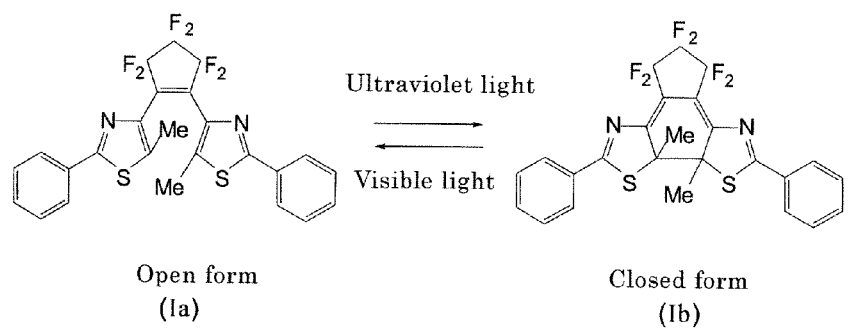
FIG. 3 shows the chemical structures of an open-ring isomer (Ia) and a closed-ring isomer (Ib) of a specific example of a photochromic diarylethene compound utilized in the light-driven actuator element of the present invention.

For example, FIG. 2 shows the molecular packing (1) at the (010) face and the molecular packing (2) at the (00-1) face of a plate crystal of a diarylethene compound wherein $R^1$ in Formula (I) is a hydrogen atom (see FIG. 3). The (010) face corresponds to the crystal front face and the (00-1) face to the crystal side face. It can be seen from side face (00-1) that the molecules are packed in parallel along the long axis of the crystal (corresponding to the a-axis direction in FIG. 2(2)). The molecular packing (3) at the (021) face and the molecular packing (4) at the (0-11) face of a rod-like crystal is also shown. As in the plate crystal, the molecules are packed by stacking in the contractible direction. When such a compound is irradiated with light (ultraviolet light/visible light), the shape of the crystal changes owing to contraction/expansion (bending by local contraction/restoration) of the crystal in the direction of the arrows along the a-axis in the drawing. The bending deformation is similar to the behavior of a bimetal strip formed by bonding together two metal strips having different degrees of contraction. The change of the molecular structure from open ring to closed ring caused by photoisomerization decreases the thicknesses of the individual molecules, and since this operates as an interaction between the molecules relative to the a-axis direction, intermolecular distance decreases to cause contraction. Conversely, the molecule thickness increases upon change from closed-ring isomer to open-ring isomer so that the crystal expands. In other words, the crystal contracts (or bends owing to local contraction) on exposure to ultraviolet light and resumes its original shape on exposure to visible light.

It is known that application of a force perpendicular to the surface of molecules packed in parallel along the crystal axis shifts the molecular orientation so that the crystal bends (Non-Patent Reference 3). However, differently from this, the light-driven actuator element of the present invention is based on crystal shape change induced by changing the intermolecular distance of the crystal by the contactless driving force of photoirradiation, without direct application of external force. In other words, the light-driven actuator element of the present invention is characterized in comprising a crystal of a diarylethene compound whose shape is changed by photoisomerization. The crystal of diarylethene compound is characterized in having a crystal structure wherein the diarylethene molecules are packed in parallel along the direction of the crystal axis of contraction and expansion.

[Non-Patent Reference No. 3] C. M. Reddy et al., Chem. Commun., 2005, 3945-3947.

The light-driven actuator element of the present invention is not limited to the use of a crystal of a single type of diarylethene compound as set out in the foregoing but can alternately comprise a small amount of a crystal of another type of diarylethene compound insofar as there is no substantial change in the crystal lattice structure and the aforementioned molecular orientation is maintained. For example, a mixed crystal of the diarylethene compound of Formula (I) above in which $R^1$ is a hydrogen atom (compound Ia of FIG. 3: 1,2-bis(5-methyl-2-phenyl-4-thiazolyl)perfluorocylopentene) and the diarylethene compound represented by Formula (IIa) below (mixed crystal molar ratio: Ia/IIa=9/1) also gives rise to reversible shape change when irradiated with light (ultraviolet light/visible light). However, as pointed out in Control Experiment 1, photoinduced shape change ceased to be observed when the layered molecular packing was no longer maintained owing to increase in the weight ratio of (IIa).

[CF 4]

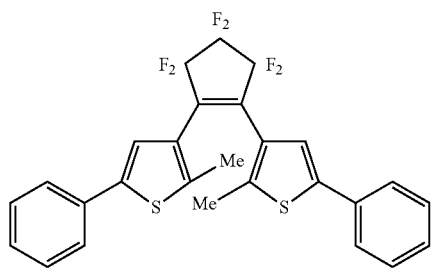

(IIa)

In Formula (IIa), Me represents a methyl group.

The bulk single crystal of the diarylethene compound used in the light-driven actuator element of the present invention can be produced by recrystallization from an organic solvent, and the form of the crystal can be varied by selecting the type of solvent. For example, plate crystal is obtained by recrystallization from hexane and rod-like crystal is obtained by recrystallization from ethanol.

The obtained bulk single crystal can readily be converted into micrometer-size fine crystals using the sublimation crystal growth process. For example, fine crystals of micro-order size can be obtained by triturating the obtained bulk single crystal on powder paper, transferring it to a sample pan, placing a cover glass on top of the pan, and slowly heating to around the melting point of 155° C.

The diarylethene compound used in the light-driven actuator element of the present invention exhibits photochromic reactivity in the single crystal state. The photochromic reactivity in the single crystal state is ascertained by, for example, observation under a polarizing microscope or single crystal X-ray crystallographic analysis.

The present invention provides a minute actuator element which utilizes photochromic molecules that reversibly form two molecular structures upon photoirradiation and which can be repeatedly used as a non-contact-drive type actuator not requiring wiring or the like. Since the sensor and drive units of the light-driven actuator element of the present invention are integrated at the molecular level, size reduction to or below the micrometer order is possible. Moreover, the light-driven actuator element has the advantage of a phenomenally fast microsecond order response speed comparable to the vibration period of a piezoelectric element. Still another advantage of the light-driven actuator element of the present invention is that its displacement is determined by the light quantity (displacement can be controlled by controlling the light quantity).

The light-driven actuator element of the present invention is driven in air, ordinarily at room temperature. The photochromic diarylethene compound used in the present invention has high thermal stability and cyclic durability and, as such, offers highly excellent practical properties from the viewpoint of application to an actuator product.

The features of the present invention will be described in a more concrete manner with reference to the following working examples, which are not for restricting the present invention. $^1$H-NMR appearing in the description of the product properties in the examples set out in the following refers to the respective proton nuclear magnetic resonance spectra. $CDCl_3$ stands for heavy chloroform. In the proton nuclear magnetic resonance spectral data, the parenthesized symbols a, d, and m respectively represent singlet, doublet and multiplet, and 1H, 2H, 3H etc. mean spectral intensity equivalent of 1, 2, 3 ... protons.

Example 1

Synthesis of Photochromic Compound

The compound Ia shown in FIG. 3 was synthesized as the crystalline photochromic diarylethene compound used in the light-driven actuator element of the present invention.

Synthesis of 2-phenyl-5-methyl-4-thiazolyl (I-1)

[CF 5]

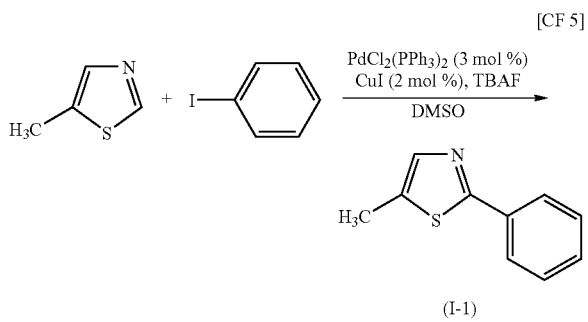

To a three-neck flask under an argon atmosphere were added CuI (210 mg, 1.1 mmol), $PdCl_2(PPh_3)_2$ (800 mg, 1.1 mmol), and iodobenzene (2.9 g, 14 mmol). Next, using a syringe, distilled DMSO (60 mL), thiazolyl (3 g, 35 mmol) and TBAF (1 M THF solution) 37 mL were added to obtain a mixed solution that was subjected to 5 or 6 cycles of freeze-degassing and stir-heated for 40 hr on a 65° C. oil bath. After the reaction, a large amount of water was added, the organic layer was extracted with diethyl ether, and the extract was dried by addition of anhydrous magnesium sulfate. The product was isolated using a silica gel column (15% AcOEt/hexane). The yield was 84%.

Yellow Oily Product $^1$H-NMR (200 MHz, CDCl$_3$) δ 7.89 (m, 2H), 7.45 (m, 4H), 2.51 (d, J=1.2 Hz, 3H).

Synthesis of 4-bromo-5-methyl-2-phenyl thiazolyl (I-2)

[CF 6]

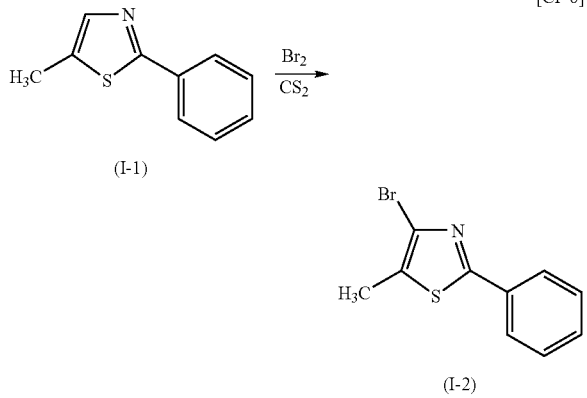

Bromine was added dropwise to the solution of the compound (I-1) in carbon disulfide (15 mL) at 0° C. over 20 min and stirred for 1.5 hr. After further stirring for 20 hr at room temperature, the reaction was terminated by addition of aqueous solution of sodium thiosulfate. The organic layer was extracted with ethyl acetate, and the extract was dried by addition of anhydrous magnesium sulfate. Following removal of solvent, 0.3 g of 4-bromo-5-methyl-2-phenyl thiazole (I-2) was obtained by isolation using silica column chromatography (AcOEt/hexane=1/9) at a yield of 35% and 42% of compound (I-1) was recovered.

Colorless Oily Product $^1$H-NMR (200 MHz, CDCl$_3$) δ 7.87 (m, 2H), 7.42 (m, 3H), 2.44 (s, 3H).

Synthesis of 1-(5-methyl-2-phenyl-4-thiazolyl)perfluorocylopentene (I-3)

[CF 7]

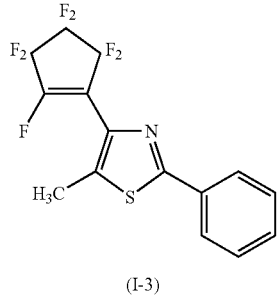

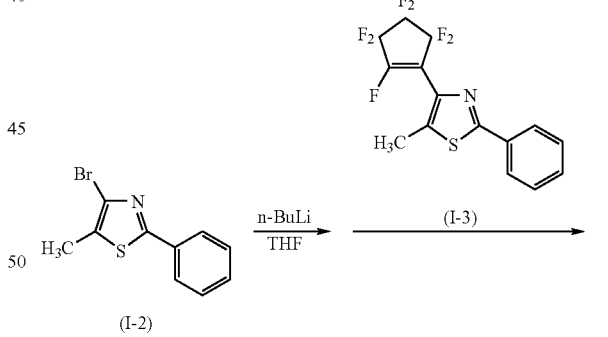

To an anhydrous THF solution (16 mL) of 500 mg (2.05 mmol) of compound (1-2) cooled to −80° C. under an argon atmosphere was added dropwise 1.22 mL (1.95 mmol) of 1.6 M solution of n-butyllithium in hexane, followed by stirring for 15 min. Next, an anhydrous THF solution (2 mL) of 0.27 mL of perfluorocylopentene (0.93 mmol) was slowly added dropwise. After stirring for 2.5 hr, the temperature of the reaction solution was slowly brought to room temperature. The reaction was terminated by addition of water. The organic layer was extracted with ether. The extract was dried with magnesium sulfate and solvent was removed by distillation after filtering. The resultant was developed by a silica gel column (AcOEt/hexane=1/9) to obtain 500 mg of 1-(5-methyl-2-phenyl-4-thiazolyl)perfluorocylopentene at a yield of 69%.

Colorless Solid Product $^1$H-NMR (200 MHz, CDCl$_3$) δ 7.94-7.86 (m, 2H), 7.50-7.42 (m, 3H), 2.54 (s, 3H).

Synthesis of 1,2-bis(5-methyl-2-phenyl-4-thiazolyl)perfluorocylopentene (Ia)

[CF 8]

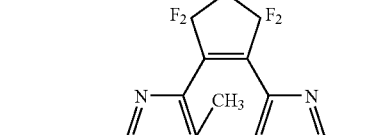

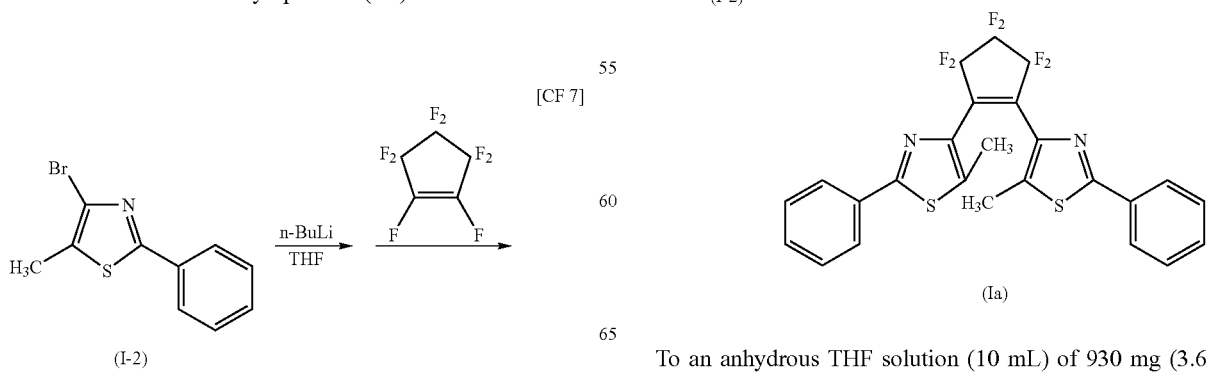

To an anhydrous THF solution (10 mL) of 930 mg (3.6 mmol) of compound (I-2) cooled to −80° C. under an argon atmosphere was added dropwise 2.4 mL (3.8 mmol) of 1.6 M solution of n-butyllithium in hexane, followed by stirring for 15 min. Next, an anhydrous THF solution (2 mL) of 1.2 g of 1-(5-methyl-2-phenyl-4-thiazolyl)perfluorocylopentene (3.2 mmol) was slowly added dropwise. After stirring for 2.5 hr, the temperature of the reaction solution was slowly brought to room temperature. The reaction was terminated by addition of water, and the organic layer was extracted with ether. The extract was dried with magnesium sulfate, and solvent was removed by distillation after filtering. The resultant was developed by a silica gel column (AcOEt/hexane=1/9) to obtain 800 mg of 1,2-bis(5-methyl-2-phenyl-4-thiazolyl)perfluorocylopentene (Ia) at a yield of 46%.

Colorless Solid Product $^1$H-NMR (200 MHz, CDCl$_3$) δ 7.94-7.86 (m, 2H), 7.50-7.42 (m, 3H), 2.54 (s, 3H).

Example 2

Photochromic Reactivity Test and Structure Analysis

The compound (Ia) synthesized in Example 1 was dissolved in hexane, and the solution was concentrated to extract solid crystals by gradually evaporating the solvent. Observation of the deposited colorless crystals with a microscope revealed formation of plate crystals of lozenge shape having 70° and 110° corners. The colorless crystals turned red when irradiated with ultraviolet light (365 nm). The red color was stable and did not fade so long as the crystals were kept in the dark.

Figure 4:
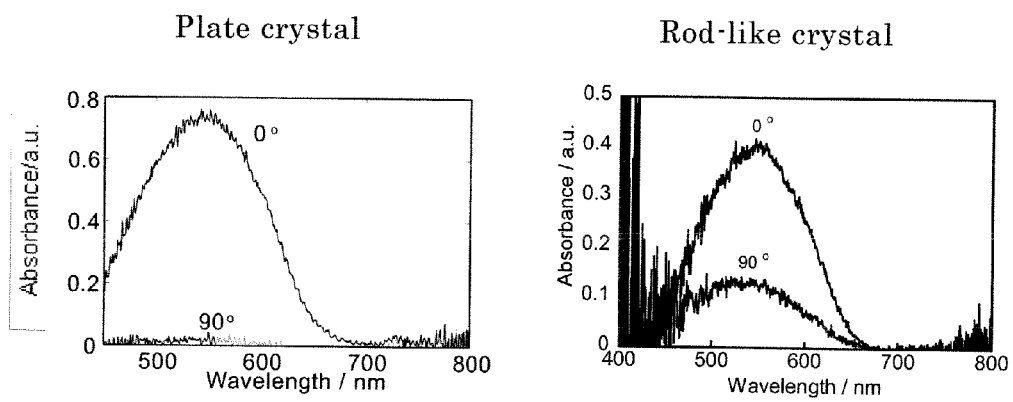
FIG. 4 illustrates spectral change in polarizing absorption when plate crystal and rod-like crystal of a diarylethene compound utilized in the light-driven actuator element of the present invention were irradiated with ultraviolet light (Examples 2 and 3).

The spectrum shown on the left side of FIG. 4 was obtained by observing the (0-10) face of the crystal colored red by ultraviolet light irradiation under polarized light (linearly polarized light). Thus it was found that red appears at a specific angle and disappears when the angle is rotated by 90°. Measurement of the red alignment coefficient $(A_1-A_2)/(A_1+2A_2)$ at 550 nm gave the very high value of 0.73. In the definition of the alignment coefficient, $A_1$ represents absorbance at the angle at which red was most strongly observed and $A_2$ represents absorbance upon rotation by 90° from this angle.

Rod-like crystals were obtained by recrystallizing the compound (Ia) after dissolving it in ethanol. X-ray structure analysis showed the plate and rod-like crystals to be crystallographically identical. The polarized light absorption spectrum of the (0-2-1) face of the crystal colored red by ultraviolet light irradiation is shown on the right side of FIG. 4. Measurement of the alignment coefficient $(A_1-A_2)/(A_1+2A_2)$ at 550 nm gave the value of 0.45.

Figure 5:
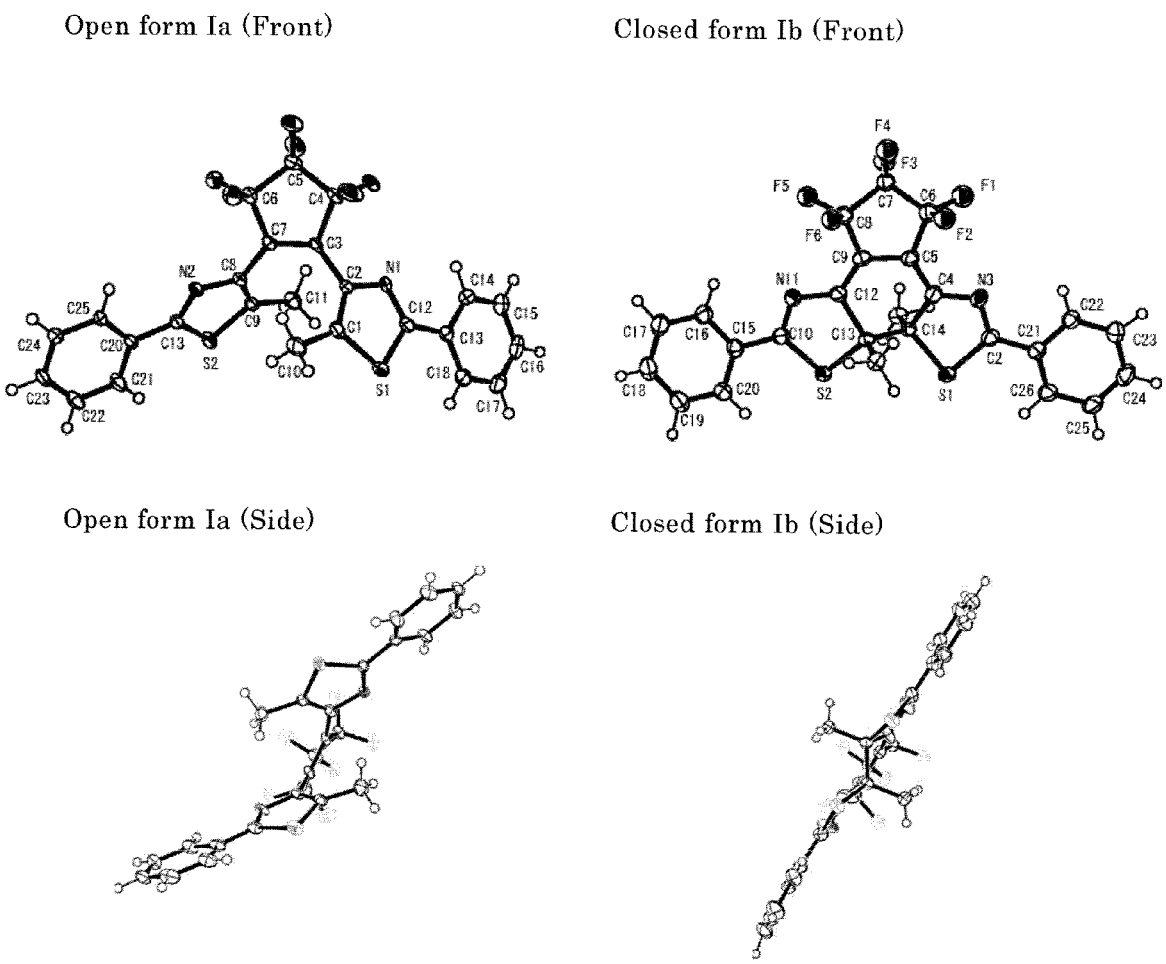
FIG. 5 shows diagrams of single crystal X-ray structure analysis of the open isomer and closed isomer of a diarylethene compound utilized in the light-driven actuator element of the present invention (Examples 2 and 3).

The results (ORTEP diagrams) of X-ray structure analysis of the compound (Ia) and compound (Ib) are shown in FIG. 5, Open form (Front/Side) and FIG. 5, Closed form (Front/Side), respectively. The ellipsoids represent coordinates by which the fluorine, nitrogen and sulfur atoms can be located with 50% probability. The small spheres represent hydrogen atoms.

Compound (Ia) analysis results: monoclinic system, space group P2(1)/n; unit cell length A=7.236(2) Å, B=25.752(8) Å, C=12.611(4) Å, α=90°, β=102.432(5)°, γ=90°; unit cell volume 2295.0(12) Å, number of molecules per unit cell (Z)=4, density (calculated) 1.512; F2 value 0.989; R value (I>2σ(I)R1=0.058, wR2=0.1150.

Compound (Ib) analysis results: monoclinic system, space group P2(1)/c; unit cell length A=11.8283(2) Å, B=18.2383(2) Å, C=11.8745(2) Å, α=90°, β=118.5760(10)°, γ=90°; unit cell volume 2249.61(6) Å, number of molecules per unit cell (Z)=4, density (calculated) 1.543; F2 value 1.604; R value (I>2σ(I)R1=0.068, wR2=0.080.

Example 3

Crystal Growth and Photosresponsive Shape Change

Crystals of the compound (Ia) prepared in Example 2 were placed between sheets of paraffin paper and triturated by pounding to increase their surface area. The powdery crystals were placed in a sublimation pan, covered with a cover glass, and slowly heated from room temperature to 145° C. (to near the melting point of 155° C.) using a melting point apparatus. The sublimation pan was a DSC (differential scanning calorimeter) aluminum sample pan having good thermal conductivity. Many fine crystals measuring between a few millimeters and several tens of micrometers adhered to the cover glass, and fine crystals having clean surfaces were obtained. The crystals were of two types, plate and rod-like. They were the same as crystals obtained by recrystallization from hexane and ethanol, respectively, and were determined to be identical from X-ray structure analysis.

Figure 6:
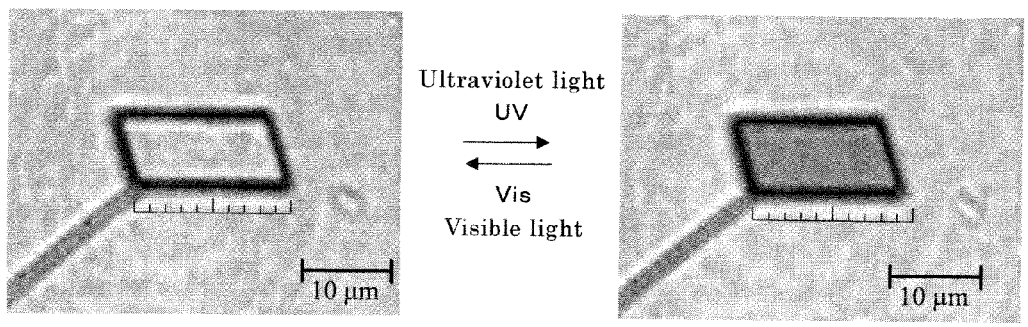
FIG. 6 illustrates photosresponsive shape change of a plate crystal of a diarylethene compound that is a constituent of the light-driven actuator element of the present invention (Example 3).
Figure 7:
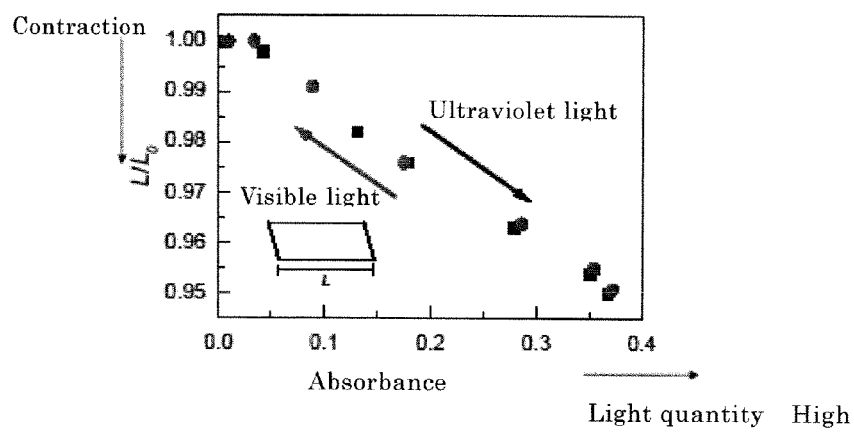
FIG. 7 illustrates the light quantity-displacement characteristic of a plate crystal of a diarylethene compound that is a constituent of the light-driven actuator element of the present invention (Example 3).

When a plate crystal obtained in the foregoing manner was irradiated with 365 nm ultraviolet light, its color was found to change from colorless to red and its longer side (major axis) contracted about 5%. It recovered its original length when irradiated with visible light (see FIG. 6). FIG. 7 shows the absorbance and degree of contraction. Upon irradiation with ultraviolet light, the crystal turned from colorless to red and its major axis ($L/L_0$) contracted about 5% (■ plots), and upon irradiation with visible light, the red color disappeared and the crystal major axis ($L/L_0$) recovered its original length (● plots). The displacement (degree of contraction) was proportional to the light quantity (absorbance), the contraction and expansion were substantially the same, and no hysteresis was observed.

The rod-like crystal exhibited shape change whereby its tip bent in the direction of irradiation upon exposure to ultraviolet light and was restored by irradiation with visible light.

Example 4

Cyclic Restorability of Photosresponsive Shape Change

Figure 8:
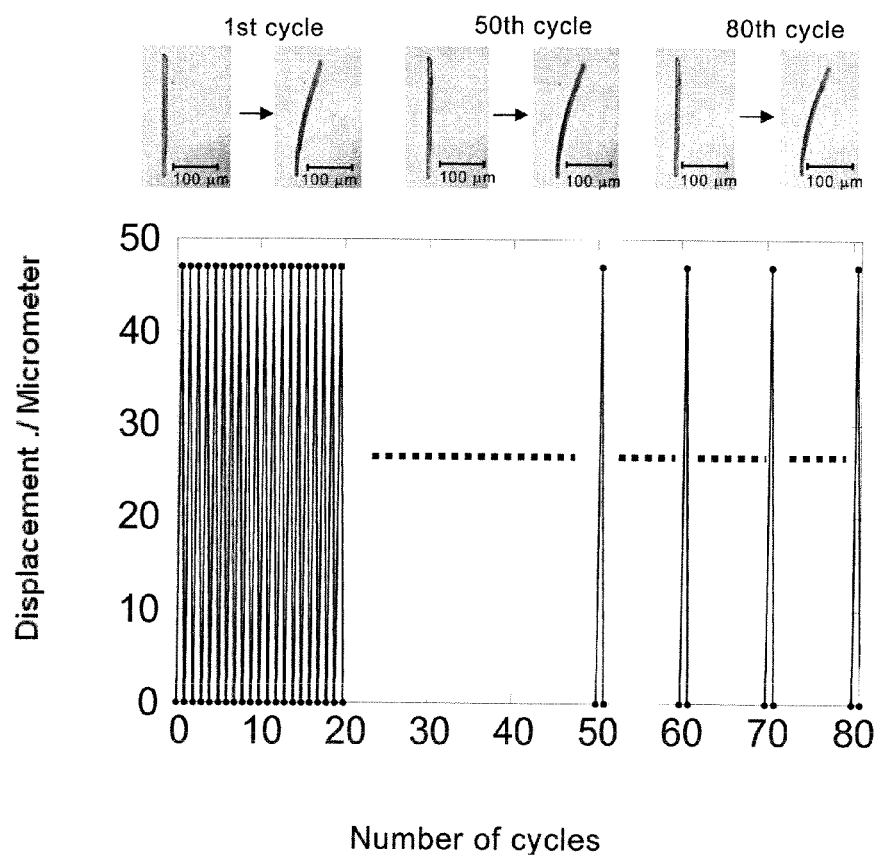
FIG. 8 shows that reversible bending occurred repeatedly when a diarylethene compound that is a constituent of the light-driven actuator element of the present invention was irradiated with light (Example 4).

An experiment was conducted with respect to the number of photoirradiation-induced shape changes of a rod-like crystal (225×7.5×5 micrometer). FIG. 8 shows a graph in which the number of repetitions is represented on the horizontal axis and the distance moved is represented on the vertical axis. Upon irradiation with 365 nm ultraviolet light for 0.1 s, the tip of the crystal bent (moved 47 micrometer) in the direction of irradiation. The tip returned to the original position upon irradiation with 500 nm or longer visible light for 6 min. The process could be repeated 80 or more times.

Example 5

Photoresponse Speed

Figure 9:
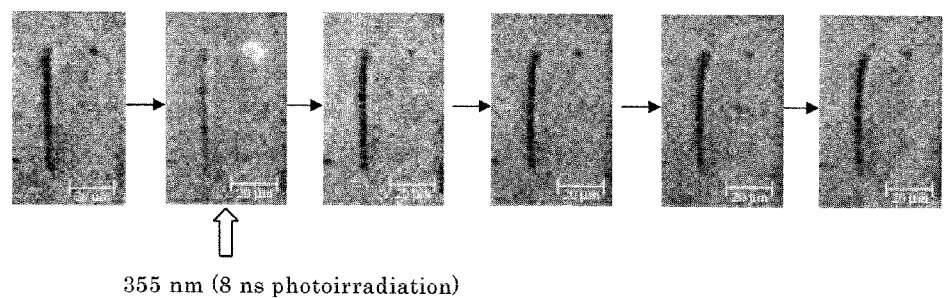
FIG. 9 shows dynamic images of a diarylethene compound that is a constituent of the light-driven actuator element of the present invention when irradiated with ultraviolet light (Example 5).

The photoresponse speed of the shape change of a rod-like crystal (60×5×5 micrometer) was measured using a high-speed camera (25 microsecond per frame). The dynamic photographs (6 frames) are shown in FIG. 9. Anthracene was disposed next to the rod-like crystal for ascertaining photoirradiation. When the rod-like crystal was irradiated with a pulsed YAG laser (8 nanosec), anthracene fluorescence was observed in the second photoimage frame. This means that the rod-like crystal was photoirradiated at the time point of the second image frame. Next, in the third image frame, it was seen that the tip of the rod-shaped crystal had bent slightly, and the crystal bending process could also be seen in the fourth image frame. It was found that the photoresponse speed was on the 25 microsecond order.

It was discovered that the response speed is phenomenally fast and comparable to the vibration period of a piezoelectric element.

Example 6

Applicability as a Light-Driven Actuator Element (1)

Figure 10:
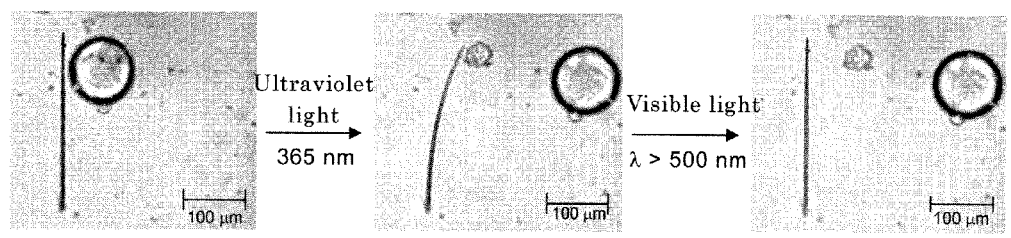
FIG. 10 illustrates the effect exerted on a silica particle by irradiating a diarylethene compound that is a constituent of the light-driven actuator element of the present invention with ultraviolet light (Example 6).

Applicability as a light-driven actuator element was studied. Adjacent to a rod-like crystal (250×8×8 micrometer) was disposed a silica gel particle of approximately 50 times greater mass. The rod-like crystal bent when irradiated with ultraviolet light and could flick the silica gel particle 100 micrometers or farther. And when irradiated with visible light, the rod-like crystal resumed its original state. Related images are shown in FIG. 10. These results demonstrate the possibility of use as an actuator element that can be reversibly driven by photoirradiation.

Example 7

Applicability as a Light-Driven Actuator Element (2)

Figure 11:
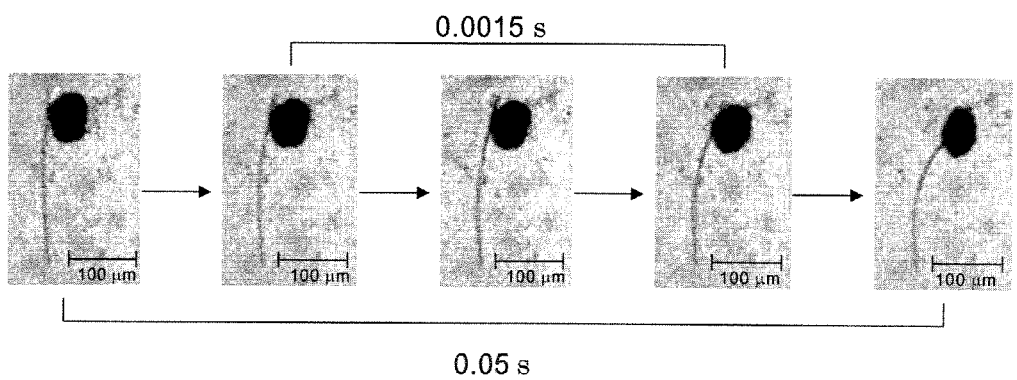
FIG. 11 illustrates the effect exerted on a gold particle by irradiating a diarylethene compound that is a constituent of the light-driven actuator element of the present invention with ultraviolet light (Example 7).

Adjacent to a rod-like crystal (250×8×8 micrometer) was disposed a gold particle of approximately 90 times greater mass. The behavior of the rod-like crystal on irradiation with ultraviolet light was investigated using a high-speed camera (500 microsecond per frame). The dynamic photographs (5 frames) are shown in FIG. 11. The first frame is an image showing the rod-like crystal having bent upon irradiation with ultraviolet light so that its tip contacted the gold particle. The second, third and fourth dynamic photograph frames revealed that the crystal moved the gold particle considerably within a period of 0.0015 s. Particularly in the fifth dynamic photograph frame, there was noted the phenomenon of the tip of the crystal slipping behind the gold particle and lifting it upward. This dynamic behavior took place within 0.05 s.

Example 8

Photosresponsive Shape Change of Mixed Crystal

The compound represented by Formula (Ia) shown above and the compound represented by the Formula (IIa) shown above were dissolved in hexane and recrystallized to obtain mixed crystals containing two components (Ia/IIa). Compositional analysis showed that Ia was contained more abundantly (molar ratio: Ia/IIa=9/1). The appearance of the crystal was similar to that of Ia and the crystallographic parameters (unit cell parameters) by X-ray structure analysis were also similar to those of Ia set out in Example 2.

Compound (mixed crystal of Ia and Ia) analysis results: monoclinic system, space group P2(1)/n; unit cell length A=7.091(3) Å, B=24.868(12) Å, C=12.256(6) Å, $\alpha$=90°, $\beta$=102.575(5)°, $\gamma$=90°; unit cell volume 2109.3(17) Å, number of molecules per unit cell (Z)=4, density (calculated) 1.507; F2 value 1.104; R value (I>2$\sigma$(I)R1=0.071, wR2=0.1775.

The (Ia/IIa) crystals were triturated to obtain powdery crystals that were placed in a sublimation pan, covered with a cover glass, and slowly heated from room temperature to 145° C. using a melting point apparatus. Many fine crystals measuring between a few millimeters and several tens of micrometers adhered to the cover glass, and fine crystals having clean surfaces were obtained. The fine crystals were similar in shape to Ia, and plate and rod-like crystals were obtained.

Figure 12:
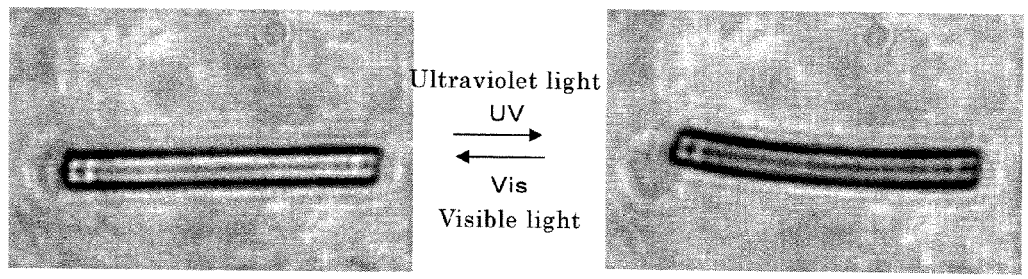
FIG. 12 illustrates photosresponsive shape change of a mixed crystal (plate crystal and rod-like crystal) of a diarylethene compound that is a constituent of the light-driven actuator element of the present invention.
Figure 12:
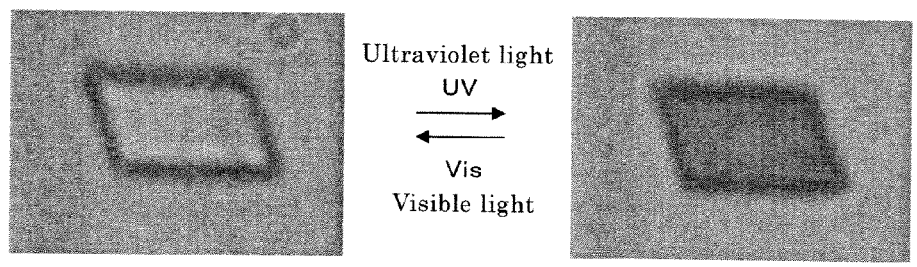

When an obtained rod-like crystal was irradiated with 365 nm ultraviolet light, its color changed from colorless to reddish purple and the crystal bent. Upon irradiation with visible light, it returned to its original shape. The plate crystal was observed to experience similar shape change of the crystal contracting and expanding upon irradiation with ultraviolet light/visible light. (See FIG. 12.)

<Control Experiment 1>

Mixed crystals (Ia/IIa) containing IIa more abundantly (molar ratio: Ia/IIa=1/9) were obtained as a control. The appearance of the crystals was similar to that of IIa and the crystallographic parameters (unit cell parameters) by X-ray structure analysis were also similar to those of IIa. The crystallographic parameters differed from those of Ia.

Compound (mixed crystal of Ia and IIa) analysis results: orthorhombic system, space group triclinic; unit cell length A=11.808(3) Å, B=13.568(3) Å, C=14.917(3) Å, $\alpha$=81.763° (3), $\beta$=82.255(5)°, $\gamma$=82.303(3)°; unit cell volume 2327.5(8) Å, number of molecules per unit cell (Z)=4, density (calculated) 1.491; F2 value 1.039; R value (I>2$\rho$(I)R1=0.044, wR2=0.1105.

The (Ia/IIa) mixed crystals were triturated to obtain powdery crystals that were placed in a sublimation pan, covered with a cover glass, and slowly heated from room temperature to 135° C. using a melting point apparatus. Many fine crystals adhered to the cover glass, and fine crystals having clean surfaces were obtained. The fine crystals were similar in shape to Ia; shapes similar to Ia could not be obtained. The fine crystals did not exhibit light-induced shape change when irradiated with 365 nm ultraviolet light.

Figure 13:
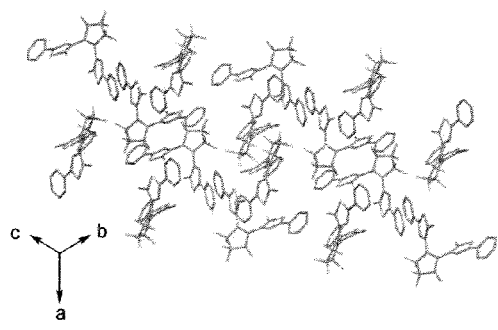
FIG. 13 illustrates the molecular packing of a mixed crystal of a diarylethene compound (molar ratio: Ia/IIa=1/9). (1) (001) face, (2) (100) face.
Figure 13:
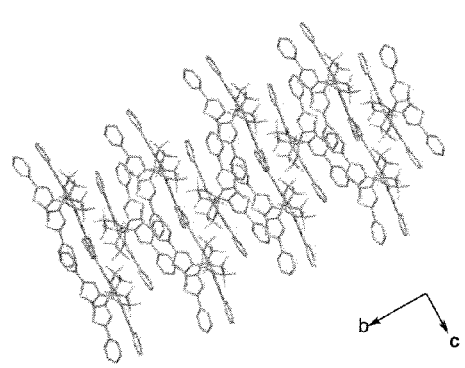
Figure 13:
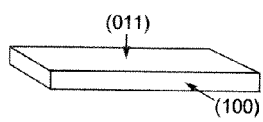

FIG. 13 shows the molecular packing of the crystal front (1) (001) face and side (2) (100) face. It can be seen from the side face that the molecules are packed without assuming a layered structure.

Thus, while the diarylethene compound Ia exhibits shape changes like contraction and bending on radiation with ultraviolet light, the crystal which becomes one in which Ia is contained in IIa owing to increase in the weight ratio of IIa does not exhibit shape change. This is because the molecules in the mixed crystal no longer have a crystal structure with layered packing <Control Experiment 2>

1,2-bis(2,5-dimethyl-3-thienyl)perfluorocylopentene was triturated to obtain powdery crystals that were placed in a sublimation pan, covered with a cover glass, and slowly heated from room temperature to 105° C. using a melting point apparatus. Many fine crystals measuring between a few millimeters and several tens of micrometers adhered to the cover glass, and fine crystals having clean surfaces were obtained. Rod-like and plate shapes were obtained. The fine crystals did not exhibit light-induced shape change when irradiated with 365 nm ultraviolet light.

Figure 14:
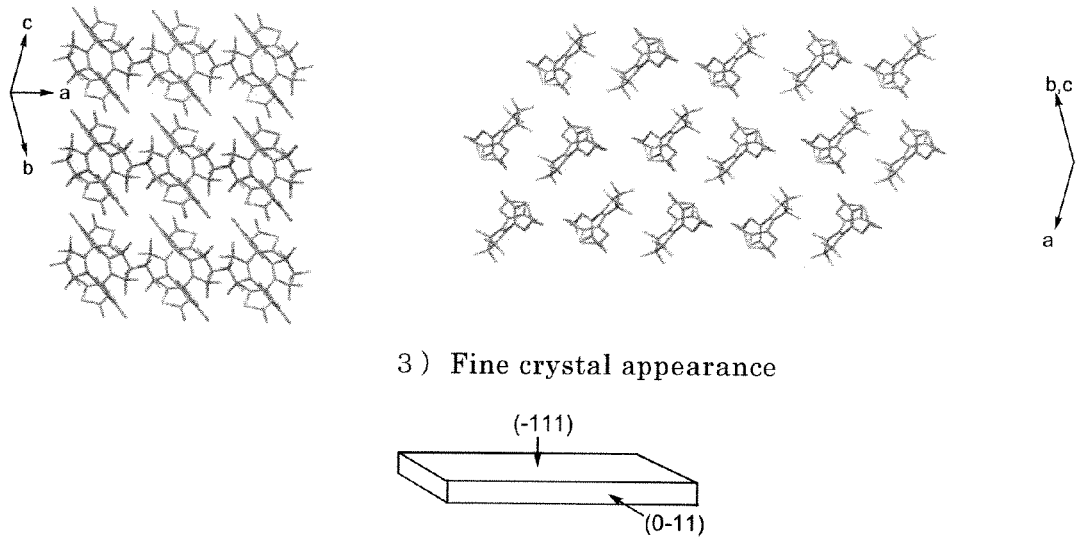
FIG. 14 illustrates the molecular packing of a diarylethene compound that does not exhibit light-induced shape change. (1) (−111) face, (2) (0-11) face.

FIG. 14 shows the molecular packing of the crystal front (1) (−111) face and side (2) (0-11) face. It can be seen from the side face that the molecules are packed along the major axis of the crystal (the molecules are packed upside down) but the molecular packing is not of a layered structure with the molecules aligned in parallel as shown in FIG. 2.

INDUSTRIAL APPLICABILITY

As can be seen from the foregoing description, the photochromic compound used in the present invention enables ready preparation of micrometer size crystals and exhibits reversible crystal shape change on photoirradiation. By this light-induced shape change, moreover, the crystal can move an object that has up to more than 90 times its own mass. Thus, the invention actuator element comprising the photochromic compound can be expected to find uses as a light-driven actuator element in various micromechanical field applications such as the following:

(1) Embedded in the microchannel of a microreactor. The proportionality between displacement and light quantity can be utilized to control the flow rate (flow velocity) of material in the microchannel with high accuracy, thereby facilitating reaction control to enable desired control of production quantity and the like. Conceivable applications include on-demand production of chemicals and functional chemical products.

Figure 15:
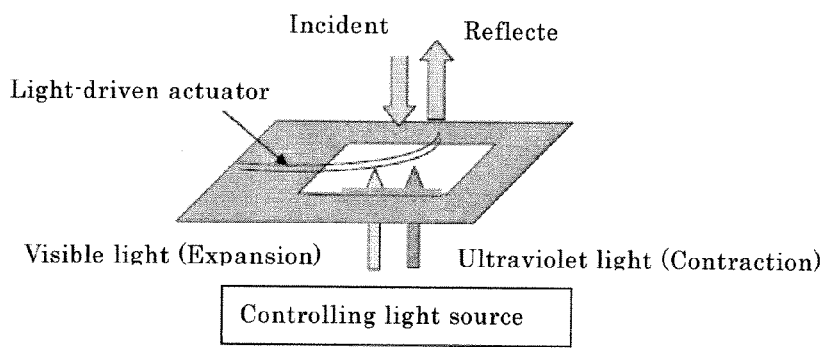
FIG. 15 shows applications of the light-driven actuator element of the present invention.
Figure 15:
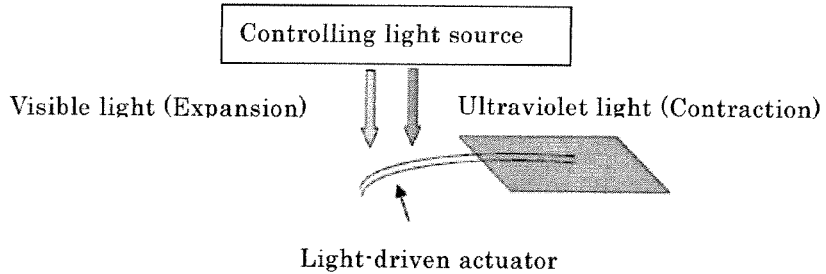

(2) Use as a microscanner or scanning mirror (see FIG. 15A). The structure is simpler than that of the conventional ones using PZT film because the structure requires only the light-driven actuator element and a controlling light source. Further, compared with a PZT, which has hysteresis, control is easy because the relationship between displacement and light quantity is linear.

(3) Use as a cantilever (see FIG. 15B). Replacement of the conventional cantilever with a light-driven actuator element greatly simplifies the structure of an AFM, SEM or the like, thereby enabling size reduction. In addition, control is easy owing to the linear relationship between displacement and light quantity.

The invention claimed is:

1. A light-driven actuator element comprising a crystal of a diarylethene compound that changes shape upon photoisomerization, in which crystal the diarylethene molecules are packed in parallel along the direction of a crystal axis of contraction and expansion, wherein the crystal is produced by sublimation, and wherein the crystal of diarylethene compound is selected from the group consisting of:

a) a crystal of a compound represented by Structural Formula (I) below:

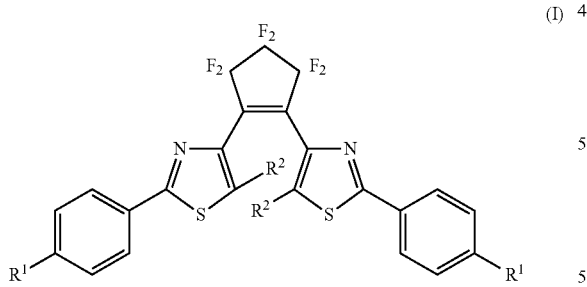

(I)

where $R^1$ represents a hydrogen atom and $R^2$ represents a methyl group; and b) a mixed crystal of the compound represented by Structural Formula (I) and a diarylethene compound represented by Formula (IIa) below:

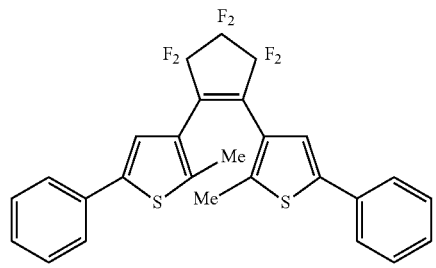

(IIa)

where Me represents a methyl group.

2. A light-driven actuator element as claimed in claim 1, wherein the crystal is a rod-like crystal.

3. A light-driven actuator element as claimed in claim 1, wherein the crystal is a plate crystal.

4. A light-driven actuator element as claimed in claim 1, wherein the crystal of diarylethene compound is a crystal of a compound represented by Structural Formula (I).

5. A light-driven actuator element as claimed in claim 1, wherein the crystal of diarylethene compound is a mixed crystal of the diarylethene compound represented by Formula (I) and the diarylethene compound represented by Formula (IIa).

6. A light-driven actuator element as claimed in claim 2, wherein the crystal of diarylethene compound is a crystal of a compound represented by Structural Formula (I).

7. A light-driven actuator element as claimed in claim 3, wherein the crystal of diarylethene compound is a crystal of a compound represented by Structural Formula (I).

8. A light-driven actuator element as claimed in claim 1, wherein the crystal is a micrometer-sized crystal.

9. A method for producing a light driven actuator element, comprising:

using a sublimation crystal growth process, converting a bulk single crystal of a diarylethene compound to a micrometer-size fine crystal that changes shape upon photoisomerization, in which micrometer-size crystal, the diarylethene molecules are packed in parallel along the direction of a crystal axis of contraction and expansion, wherein the crystal of diarylethene compound is selected from the group consisting of:

a) a crystal of a compound represented by Structural Formula (I) below:

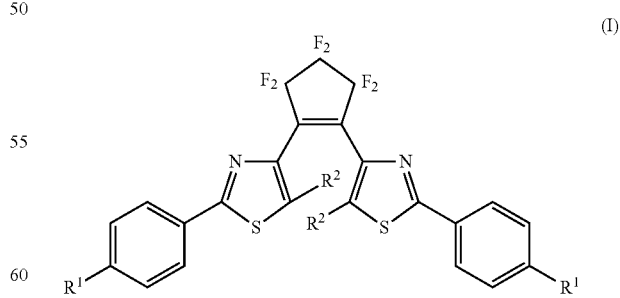

(I)

where $R^1$ represents a hydrogen atom and $R^2$ represents a methyl group; and b) a mixed crystal of the compound represented by Structural Formula (I) and a diarylethene compound represented by Formula (IIa) below:

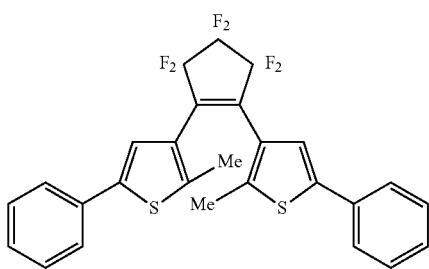

(IIa)

where Me represents a methyl group.

10. A method for operating a light driven actuator, comprising:

providing the light-driven actuator element of claim 1 comprising a crystal of a diarylethene compound that changes shape upon photoisomerization, wherein the crystal is produced by sublimation, and in which crystal, the diarylethene molecules are packed in parallel along the direction of a crystal axis of contraction and expansion; and photoirradiating the crystal to cause the change in shape of the crystal, which change is reversible.

11. The method as claimed in claim 10, wherein the crystal is a micrometer-sized crystal.

12. A light-driven actuator element as claimed in claim 6, wherein the crystal is a plate crystal and has a longer side which is capable of contracting about 5% upon photoisomerization.

13. A light-driven actuator element as claimed in claim 6, wherein the crystal is a rod-like crystal and wherein during photoisomerization, the crystal is able to move an object of 50 times its mass by its change in shape.

14. A light-driven actuator comprising the light-driven actuator element as claimed in claim 1, further comprising a first controlling light source which irradiates the crystal of the diarylethene compound causing it to change shape upon photoisomerization.

* * * * *

UNITED STATES PATENT AND TRADEMARK OFFICE
CERTIFICATE OF CORRECTION

PATENT NO. : 8,648,206 B2  
APPLICATION NO. : 12/518862  
DATED : February 11, 2014  
INVENTOR(S) : Irie et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 591 days.

Signed and Sealed this
Twenty-ninth Day of September, 2015

Michelle K. Lee
*Director of the United States Patent and Trademark Office*